United States Patent
Okada

(10) Patent No.: US 6,858,448 B2
(45) Date of Patent: Feb. 22, 2005

(54) METHOD FOR EVALUATING AND MANUFACTURING A SEMICONDUCTOR DEVICE

(75) Inventor: Kenji Okada, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 220 days.

(21) Appl. No.: 10/162,539

(22) Filed: Jun. 5, 2002

(65) Prior Publication Data

US 2003/0137305 A1 Jul. 24, 2003

(30) Foreign Application Priority Data

Jun. 7, 2001 (JP) ........................................ 2001-172020

(51) Int. Cl.[7] ............................................ H01L 21/66
(52) U.S. Cl. ........................ 438/14; 438/149; 438/151; 438/152; 324/456; 324/551
(58) Field of Search ........................... 438/14, 149, 150, 438/151, 152; 324/456, 551, 765

(56) References Cited

U.S. PATENT DOCUMENTS 6,326,792 B1 * 12/2001 Okada ........................ 324/456
6,525,544 B1 * 2/2003 Okada ........................ 324/551
6,633,177 B1 * 10/2003 Okada ........................ 324/765

FOREIGN PATENT DOCUMENTS

JP 11-186351 7/1999

OTHER PUBLICATIONS

Robin Degraeve et al. "New Insights in the Relation Electron Between Trap Generation and the Statistical Properties of Oxide Breakdown", IEEE Transactions on Electron Devices, vol. 45. No. 4, pp. 904–911, Apr. 1998.

Fumitaka Arai et al., "Extended Data Retention Process Technology for Highly Reliable Flash EEPROMs of $10^6$ to $10^7$ W/E CYCLES", IEEE 98CH36173, pp. 378–382, 36th Annual International Reliability Physics Symposium, Reno, Nevada, 1998.

* cited by examiner

*Primary Examiner*—Dung A. Le
(74) *Attorney, Agent, or Firm*—McDermott Will & Emery LLP

(57) ABSTRACT

A semiconductor device evaluation method includes the steps of measuring a total injected electron quantity before an insulating film causes a dielectric breakdown and obtaining the ratio between the total injected electron quantity and a total injected electron quantity before retention degradation is caused. In this method, using the ratio and the total injected electron quantity, the total injected electron quantity before the retention degradation is caused is calculated.

18 Claims, 12 Drawing Sheets

Weibull plot ($N_{BD}$: by measurement)

Weibull plot ($N_{BD}$: by calculation)

Weibull plot ($N_{BD}$: by calculation)

Weibull plot ($N_{BD}$, $N_{\mu B}$: by calculaton)

METHOD FOR EVALUATING AND MANUFACTURING A SEMICONDUCTOR DEVICE

BACKGROUND OF THE INVENTION

The present invention relates to an evaluation method and a fabrication method of a semiconductor device, and an apparatus and a program for evaluating the semiconductor device, and more particularly relates to a method for evaluating an insulating film in a short time and with high accuracy.

With the recent advancement of semiconductor devices to a higher degree, a demand for flash memories has been growing. In a flash memory, electrons are exchanged through an insulating film (i.e., a tunnel oxide film), and thus the characteristics of the insulating film have a large effect on device performance.

FIG. 1A is a cross-sectional view illustrating a typical cell structure of a flash memory. In the structure of FIG. 1A, a floating gate 12 is formed over a silicon substrate 10 with a tunnel oxide film interposed therebetween. A control gate 14 is formed over the floating gate 12 with a capacitance insulating film 13 interposed therebetween. Electrons are stored in the floating gate and thereby information is recorded. In the flash memory, after the electrons have been stored in the floating gate, the electrons gradually go off from the floating gate with time, resulting in change in threshold voltage. This phenomenon is called "retention characteristic".

FIG. 1B is a graph illustrating typical behaviors for the retention characteristic. In FIG. 1B, the abscissa indicates the time at log scales, while the ordinate indicates the threshold voltage. The curve a of FIG. 1B representing the most typical behavior for the retention characteristic shows that the electrons go off from the floating gate with time and that the threshold voltage gradually decreases. This behavior has been observed with respect to almost all bits. In contrast, the curve b shows that the electrons abruptly go off from the floating gate, resulting in a sharp drop of the threshold voltage. That is to say, the retention characteristic is markedly degraded. Such a phenomenon has been observed with respect to very few bits and is called "retention failure". As for the occurrence of a retention failure, various possible causes nave been considered. One of them is an anomalous leakage current (ALC) through a tunnel oxide film, which will be herein referred to as a "μB-SILC (micro B-mode stress induced leakage current)". The retention failure due to a μB-SILC will be herein referred to as "retention degradation".

The evaluation method of FIG. 2 is one of known methods for determining the retention degradation, which have been previously used.

FIG. 2 is a flowchart illustrating a method for evaluating the occurrence of retention degradation in a tunnel oxide film (indicated by the curve b of FIG. 1).

First, in Step (a), a program/erase operation (which will be herein referred to as a "P/E operation") is repeatedly performed a predetermined number of times (e.g., 10,000 times in this case) for each of the all memory cells (e.g., 16M bits), thereby applying stress to the insulating film. After the P/E operations have been completed, the memory cells are all programmed in Step (b).

Then, in Step (c), threshold voltages (Vth values) of all the memory cells at the time when the programming has been completed are recorded. Thereafter, in Step (d), all the memory cells are left to stand for a predetermined period of time (e.g., 100 hours in this case). After the predetermined time has passed, the Vth values for all the memory cells are measured again in Step (e). In Step (f), the Vth values that are obtained in Step (e) are compared to those recorded in Step (c), and then calculated are variations of the Vth values during the time period in which the cells have been left to stand. These process steps are performed at various time settings for the cells being left to stand, as necessary, so as to ascertain the number of μB-SILC occurrences in the samples and the time which it takes before a μB-SILC occurs in each sample.

However, there have been several problems with the above described method. One of them is that the stress application in Step (a) requires an enormous amount of time. Also, a huge amount of memory cell information has to be recorded in Steps (c) and (e) and made comparison in Step (f). In order to increase the accuracy in determination of the retention degradation, the memory cells have to be left to stand for several hundred to several thousand hours in Step (d). In addition, as the insulating film is improved so as to have higher quality, the retention failure occurs less readily. Accordingly, an increased number of samples need to be evaluated, and thus a longer time is required for the evaluation.

It is therefore an object of the present invention to provide a method for determining the retention degradation of a semiconductor device, such as a flash memory, in which a less number of measurements are performed in a short time and with high accuracy.

SUMMARY OF THE INVENTION

A first evaluation method of a semiconductor device in accordance with the present invention includes the steps of: measuring a total electric charge quantity ($Q_{BD}$) before an insulating film causes a dielectric breakdown; and obtaining the ratio between the total electric charge quantity ($Q_{BD}$) and a total electric charge quantity ($Q\mu_B$) before retention degradation is caused. In the method, using the ratio and the total electric charge quantity ($Q_{BD}$), the total electric charge quantity ($Q\mu_B$) before retention degradation is caused is obtained.

In a preferable embodiment of the present invention, a statistical distribution of the total injected electron quantities ($Q\mu_B$) before retention degradation is caused is obtained using a different value from a Weibull slope $\beta\mu_B$ of the total injected electron quantity ($Q_{BD}$) before the insulating film causes the dielectric breakdown as a Weibull slope $\beta\mu_B$ of the total injected electron quantity ($Q\mu_B$) before the insulating film causes the retention degradation.

In an embodiment of the present invention, a value in the range from 0.5 to 2 is used as the Weibull slope $\beta\mu_B$ of the total injected electron quantity ($Q\mu_B$) before the insulating film causes the retention degradation.

In another preferable embodiment of the present invention, the ratio between the total injected electron quantity ($Q_{BD}$) before the insulating film causes the dielectric breakdown and the total injected electron quantity ($Q\mu_B$) before the retention degradation is caused is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

A device evaluation method of a second semiconductor in accordance with the present invention includes: a first step of obtaining, according to the first semiconductor device evaluation method, a total injected electron quantity ($Q\mu_B$) before an insulating film causes retention degradation; and a second step of obtaining the number of operations N before the insulating film causes the retention degradation from the total injected electron quantity ($Q\mu_B$) and a quantity Qm of electric charge which has passed through the insulating film during an operation of a memory cell.

In an embodiment of the present invention, $Q\mu_B$/Qm is used as the number of operations N before the insulating film causes the retention degradation.

A third evaluation method of a semiconductor device in accordance with the present invention includes: a first step of obtaining a Weibull plot of a total injected electron quantity ($Q_{BD}$) before an insulating film causes a dielectric breakdown; a second step of obtaining, from the Weibull plot, a total injected electron quantity ($Q_{BD}(W_0)$) at a predetermined occurrence rate ($W_0$) of dielectric breakdown; and a third step of obtaining, according to a percolation simulation the ratio between the total injected electron quantity ($Q_{BD}(W_0)$) at $W_0$ and a total injected electron quantity ($Q\mu_B(W_0)$) at $W_0$ before retention degradation is caused. In the method, a total injected electron quantity ($Q\mu_B(W)$) before retention degradation is caused at an arbitrary occurrence rate W is obtained from a Weibull slope $\beta\mu_B$, $W_0$ and the total injected electron quantity ($Q\mu_B(W_0)$).

In a preferable embodiment of the present invention, a statistical distribution of the total injected electron quantities ($Q\mu_B$) before retention degradation is caused is obtained using a different value from a Weibull slope $\beta_{BD}$ of the total injected electron quantity ($Q_{BD}$) before the insulating film causes the dielectric breakdown as a Weibull slope $\beta\mu_B$ of a total injected electron quantity ($Q\mu_B$) before the insulating film causes retention degradation.

In another preferable embodiment of the present invention, a value in the range from 0.5 to 2 is used as the Weibull slope $\beta\mu_B$ of the total injected electron quantity ($Q\mu_B$) before the insulating film causes the retention degradation.

In still another preferable embodiment of the present invention, the ratio between the total injected electron quantity ($Q_{BD}$) before the insulating film causes the dielectric breakdown and the total injected electron quantity ($Q\mu_B$) before the retention degradation is caused is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

A fourth evaluation method of a semiconductor device in accordance with the present invention includes: a first step of obtaining, according to the third semiconductor device evaluation method, a total injected electron quantity ($Q\mu_B$) before an arbitrary occurrence rate (W) of retention degradation is reached; and a second step of obtaining the number of operations N before the occurrence rate (W) of retention degradation is reached from the total injected electron quantity ($Q\mu_B$) and a quantity Qm of electric charge which has passed through an insulating film during an operation of a memory cell.

In another embodiment of the present invention, $Q\mu_B$/Qm is used as the number of operations N before the insulating film causes the retention degradation.

In yet another preferable embodiment of the present invention, a percolation simulation is used.

A fifth evaluation method of a semiconductor device in accordance with the present invention includes: a first step of obtaining a Weibull plot of the number of P/E operations ($n_{BD}$) which have been performed before an insulating film causes a dielectric breakdown; a second step of obtaining, from the Weibull plot, the number of P/E operations ($n_{BD}(W_0)$) at a predetermined occurrence rate ($W_0$) of dielectric breakdown; and a third step of obtaining, according to a percolation simulation, the ratio between the number of P/E operations ($n_{BD}(W_0)$) at $W_0$ and the number of P/E operations ($n\mu_B(W_0)$) at $W_0$ before the retention degradation is caused. In the method, the number of P/E operations ($n\mu_B(W_0)$) before the retention degradation is caused at an arbitrary occurrence rate W is obtained from a Weibull slope $\beta\mu_B$ of the number of P/E operations ($n\mu_B$) before retention degradation is caused, $W_0$ and the number of P/E operations ($n\mu_B(W_0)$) before the insulating film causes the retention degradation.

In a preferable embodiment of the present invention, a statistical distribution of the number of P/E operations ($n\mu_B$) before the insulating film causes the retention degradation is obtained using a different value from a Weibull slope $\beta_{BD}$ of the number of P/E operations ($n_{BD}$) before the insulating film causes a dielectric breakdown as the Weibull slope $\beta\mu_B$ of the number of P/E operations ($n\mu_B$) before the insulating film causes the retention degradation.

In an embodiment of the present invention, a value in the range from 0.5 to 2 is used as the Weibull slope $\beta\mu_B$ of the number of P/E operations ($n\mu_B$) before the insulating film causes the retention degradation.

In another preferable embodiment of the present invention, the ratio between the number of P/E operations ($n_{BD}$) before the insulating film causes the dielectric breakdown and the number of P/E operations ($n\mu_B$) before the insulating film causes the retention degradation is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

A semiconductor device fabrication method in accordance with the present invention includes the steps of: preparing a completed semiconductor device including an insulating film; and determining whether the completed semiconductor device is good or no-good using any one of the semiconductor device evaluation methods.

A semiconductor device evaluation apparatus for use in carrying out the semiconductor evaluation methods in accordance with the present invention includes: a holder for holding a sample in which an insulating film to be evaluated is formed; a probe for making electrical contact with the sample placed on the holder; a measurement unit for applying an electrical stress to the sample through the probe and measuring current and/or voltage; and an analysis unit for analyzing data obtained by the measurement unit.

A semiconductor device evaluation program in accordance with the present invention makes a computer execute the steps of: a) giving instructions for applying a voltage or a current at a predetermined level to an insulating film to be evaluated, according to an input of an input device of a computer; b) monitoring the amount of current or the voltage in the insulating film and then outputting a monitored result into a display of the computer; c) storing in a memory device of the computer a cumulative time (T) which it takes for the amount of current or the voltage to reach a predetermined level, or a total injected electron quantity (Q) obtained from the relationship between the cumulative time (T) and a current density (J) ($\int J(t)dt$; the definite integral of J(t) from 0 to T); d) repeatedly performing the steps a), b) and c) the same number of times as the number of samples prepared and then storing the cumulative times (T) or the total injected electron quantities (Q) for the samples in the memory device; e) statistically analyzing, by a central processing unit of the computer, the cumulative times (T) or the total injected electron quantities (Q) for the samples which have been stored in the memory device and then calculating a time ($T_{BD}$) which it takes for the insulating film to cause a dielectric breakdown at a predetermined occurrence rate (F) or a total injected electron quantity ($Q_{BD}$); and f) calculating a time ($T\mu_B$) which it takes for retention degradation to occur or a total injected electron quantity ($Q\mu_B$) before the retention degradation occurs from the time ($T_{BD}$) or the total injected electron quantity ($Q_{BD}$) using the central processing unit.

The semiconductor device evaluation program may be constructed in the form of data recorded in a recording medium. Also, the program may be constructed in the form of data that can be transmitted by a carrier wave.

DESCRIPTION OF THE PREFERRED EMBODIMENTS

Figure 1A:
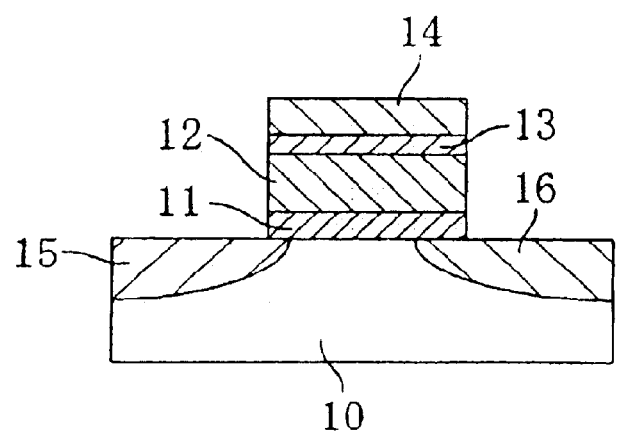
FIG. 1A is a cross-sectional view illustrating a cell structure of a flash memory.
Figure 1B:
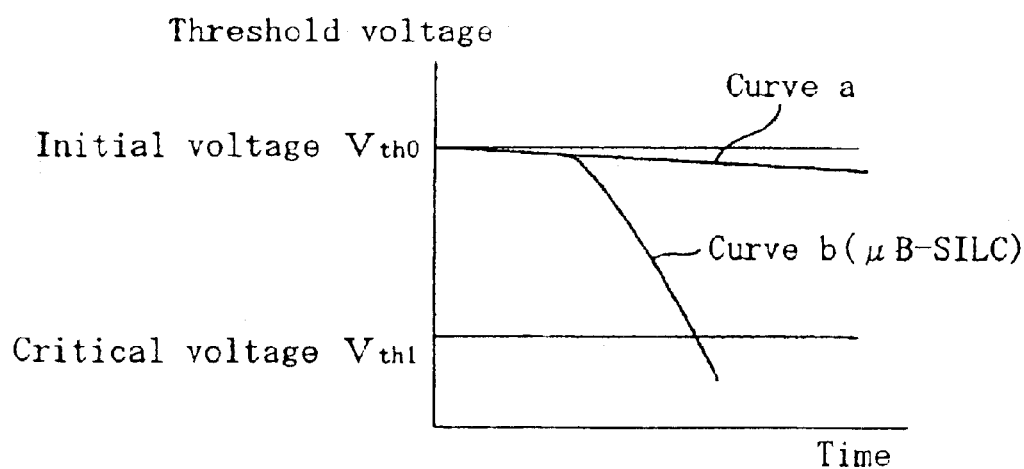
FIG. 1B is a plot illustrating changes in threshold voltage with time.
Figure 2:
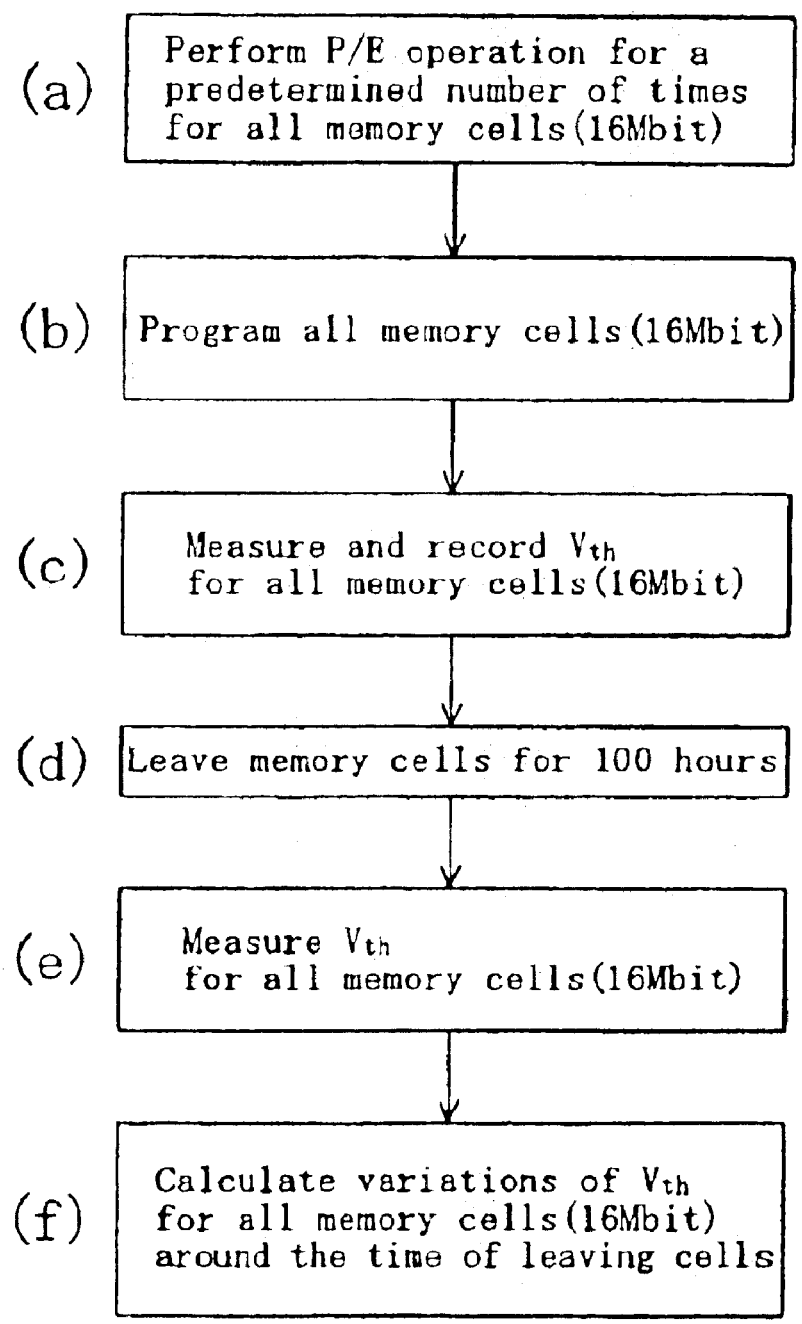
FIG. 2 is a flowchart illustrating a known method for determining retention degradation.

Detection of a dielectric breakdown in a memory cell can be made very easily and in a short time, compared to previous evaluation of retention degradation (i.e., the occurrence of a $\mu$B-SILC) in the memory cell. However, the correlation between the dielectric breakdown and the occurrence of a $\mu$B-SILC (i.e., the retention degradation) has not yet been clearly explained and thus information about a dielectric breakdown can not be utilized for the evaluation of retention degradation. The present invention clarifies the correlation between the dielectric breakdown and the retention degradation (i.e., the occurrence of a $\mu$B-SILC), and provides a method for estimating a time which it takes for the retention degradation to occur and statistics of the retention degradation from measurement results of a dielectric breakdown which can be evaluated easily and in a short time.

Correlation Between Dielectric Breakdown and $\mu$B-SILC Occurrence

The present inventor considered that an anomalous leakage current (i.e., $\mu$B-SILC) which causes a retention failure of a flash memory results from where at least two defects (electron traps) locally align in a region of a tunnel oxide film in the thickness direction of the film. I also considered that a time (or a total injected electron quantity) which it takes for a $\mu$B-SILC to occur is a time (or a total injected electron quantity) which it takes for at least two defects to locally align in a region of the tunnel oxide film in the film thickness direction.

Then, I focused on an analogy between necessary conditions of the occurrence of a $\mu$B-SILC where at least two defects locally align in a region of the tunnel oxide film in the thickness direction of the film and necessary conditions of the occurrence of a dielectric breakdown where many defects locally align in a region of the tunnel oxide film in the thickness direction of the film so as to connect with one another from the upper interface of the oxide film to the lower interface thereof (See R. Degraeve et al., IEEE Tras. on Electron Devices 45 (1998) pp. 904–910). Based on this point, I supposed that it might be possible to obtain a time (or total injected electron quantity) which it takes for a $\mu$B-SILC to occur, and also the correlation between the time (or the total injected electron quantity) which it takes for a $\mu$B-SILC to occur and a time (or total injected electron quantity) which it takes for a dielectric breakdown to occur, using a percolation simulation (See R. Degraeve et al., IEEE Tras. on Electron Devices 45 (1998) pp. 904–910) which is generally used for determining a dielectric breakdown.

The percolation simulation is a method for estimating a time which it takes for an insulating film to cause a dielectric breakdown, or estimating a statistical distribution of total defect numbers or total injected electron quantities before insulating films cause a dielectric breakdown (See R. Degraeve et al., IEEE Tras. on Electron Devices 45 (1998) pp. 904–910). In other words, the percolation simulation is used for obtaining a statistical distribution of total trap numbers which each show about how many defects are aligned with one another in the insulating film until the dielectric breakdown has occurred.

Figure 3:
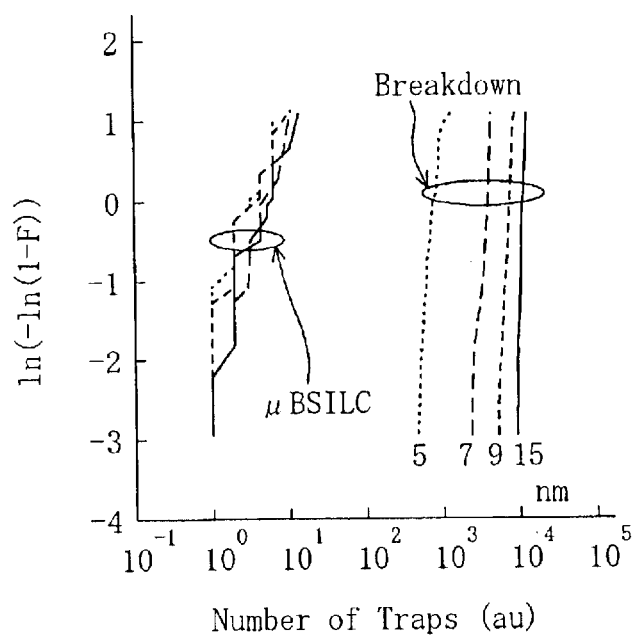
FIG. 3 is a graph illustrating simulation results of a Weibull plot of $Q_{BD}$ and $Q\mu_B$ in each of insulating films having different thicknesses.

FIG. 3 is a Weibull plot showing the results obtained by calculating the numbers of defects required for respective occurrences of dielectric breakdowns and $\mu$B-SILCs by means of the percolation simulation. In FIG. 3, the abscissa indicates the number of defects while the ordinate indicates values ($\ln(-\ln(1-F))$) calculated according to cumulative occurrence rates F of the dielectric breakdown and the $\mu$B-SILC. On the right side of the graph shown in FIG. 3, respective cases of dielectric breakdowns where silicon oxide films have thicknesses of 5 nm, 7 nm, 9 nm and 15 nm are indicated. From this graph, the total defect number (indicated by the abscissa) before an arbitrary cumulative occurrence rate is reached in each of the silicon oxide films can be calculated. On the left side of the graph shown in FIG. 3, the curves represent respective cases of $\mu$B-SILCs where the silicon oxide films have thicknesses of 5 nm, 7 nm, 9 nm and 15 nm. The curves, which are tangled with one another, show less dependence on the thickness of the silicon oxide film. The total defect number $N\mu_B$ of each of the silicon oxide films before a $\mu$B-SILC occurs can be read from the abscissa.

FIG. 3 shows that $N_{BD}$ (the total defect number before a dielectric breakdown occurs) is dependent on the thickness of the insulating film while $N\mu_B$ (the total defect number before a $\mu$B-SILC occurs) is hardly dependent on the thickness of the film. In other words, $N_{BD}$ is considered to be film-thickness dependent from the fact that many defects locally align in a region of a tunnel oxide film so as to connect with one another from the upper interface to the lower interface of the oxide film whereby a dielectric breakdown can be caused. And $N\mu_B$ is considered to be hardly film-thickness dependent from the fact that at least two defects locally align in a region of a tunnel oxide film whereby a $\mu$B-SILC can occur. According to such a difference in the film thickness dependence, as the thickness of the insulating film is reduced, the difference (or ratio) between the total number of defects, i.e., the total injected electron quantity, required before the occurrence of a $\mu$B-SILC and the total number of defects required before the occurrence of a dielectric breakdown becomes smaller. This tendency is shown in FIG. 4.

Figure 4A:
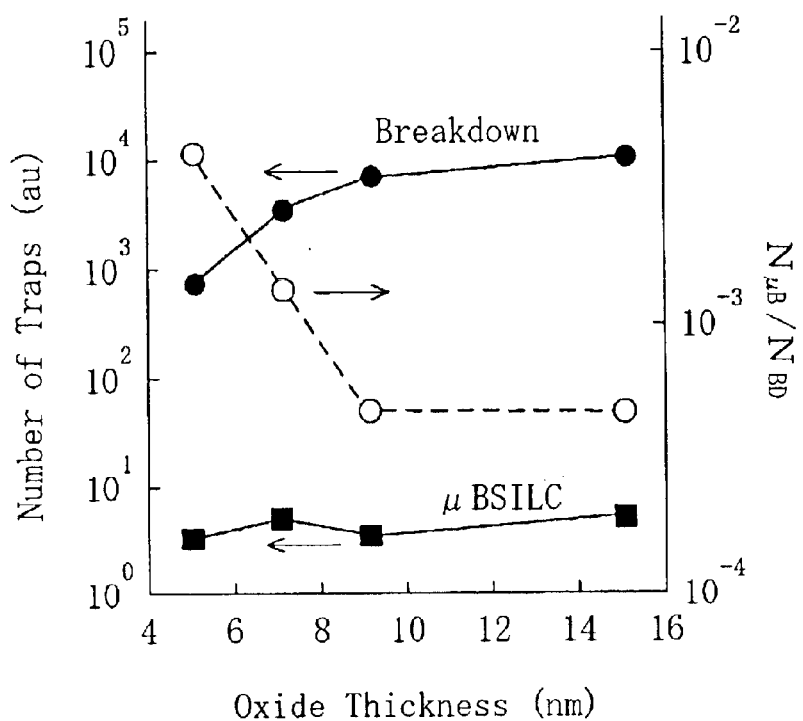
FIGS. 4A and 4B are graphs illustrating simulation results for the film thickness dependences of $N_{BD}$, $N\mu_B$ and $N_{BD}/N\mu_B$.
Figure 4B:
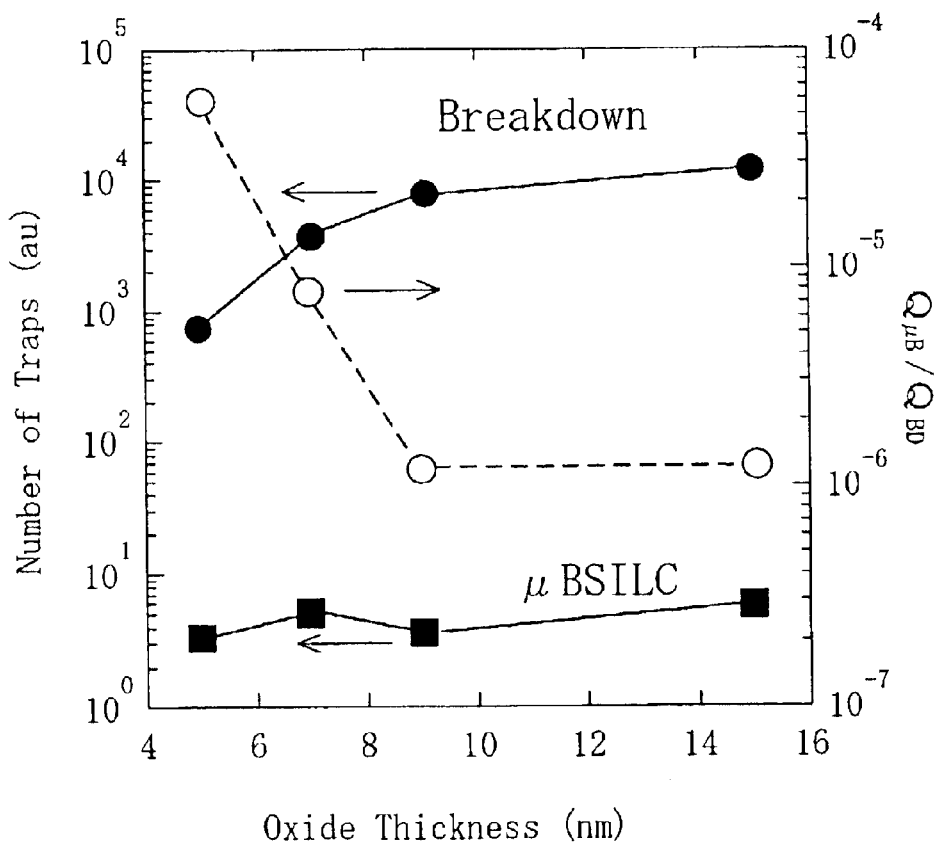

In FIG. 4A, the abscissa indicates the thickness of the silicon oxide film, the left ordinate indicates the total defect number, and the right ordinate indicates the ratio between the total defect numbers ($N\mu_B/N_{BD}$). It is considered that the ratio between the total defect numbers ($N\mu_B/N_{BD}$) can be converted to the ratio between the total injected electron quantities ($Q\mu_B/Q_{BD}$) and also the ratio between the injected charge quantities in the same insulating film. Thus, $Q\mu_B/Q_{BD}$ can be calculated from values indicated on the left ordinate. FIG. 4B is a similar graph in which the right ordinate indicates the ratio between the total electron quantities ($Q\mu_B/Q_{BD}$).

Figure 5:
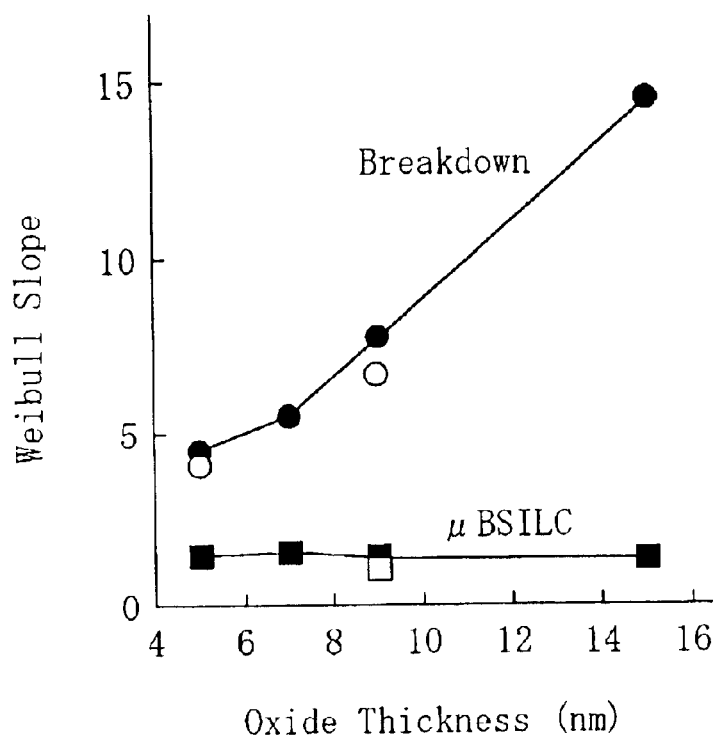
FIG. 5 is a graph illustrating simulation results for the film thickness dependences of Weibull slopes.

FIG. 5 shows the film thickness dependence of Weibull slopes which have been obtained by the simulation of FIG. 3. For the dielectric breakdown, the Weibull slope decreases as the thickness of the film is reduced. In contrast, for the $\mu$B-SILC occurrence, the Weibull slope is almost constant at about 1.4. In FIG. 5, Weibull slopes obtained by measurements are also plotted. White circles indicate the Weibull slopes of the total defect numbers before a dielectric breakdown occurs, which have been measured in 5 nm and 9 nm thick tunnel oxide films. White squares indicate the data provided in a paper by F. Arai et al. (F. Arai et al., 1998 IEEE Int. Reliability Physics Symposium, pp. 378–382, FIG. 5). Both data show good agreement with the simulation data.

As has been described, "a total injected electron quantity ($Q_{BD}$) before a dielectric breakdown occurs (electron fluence to breakdown)" or "a time ($T_{BD}$) which it takes for a dielectric breakdown to occur", and "a total injected electron quantity ($Q\mu_B$) before a $\mu$B-SILC occurs" or "a time ($T\mu_B$) which it takes for a $\mu$B-SILC to occur" can be reproduced or predicted by the percolation simulation. Accordingly, without actually observing the occurrence of $\mu$B-SILCs, the time which it takes for a $\mu$B-SILC to occur and the distribution of the $\mu$B-SILCs can be estimated by monitoring the occurrence of dielectric breakdowns and then taking statistics from the monitoring results.

Embodiment 1

As has been described, it is possible to estimate the total injected electron quantity ($Q\mu_B$) before retention degradation occurs, using the total injected electron quantity ($Q_{BD}$) before a dielectric breakdown occurs and the percolation simulation. Specifically, $Q_{BD}$ (or, electron fluence to breakdown or charge to breakdown) is measured first, the difference between $Q_{BD}$ and $Q\mu_B$ is obtained by the simulation in the next step, and then $Q\mu_B$ is calculated. The process steps for the $Q\mu_B$ estimation will be described in detail.

Figure 6:
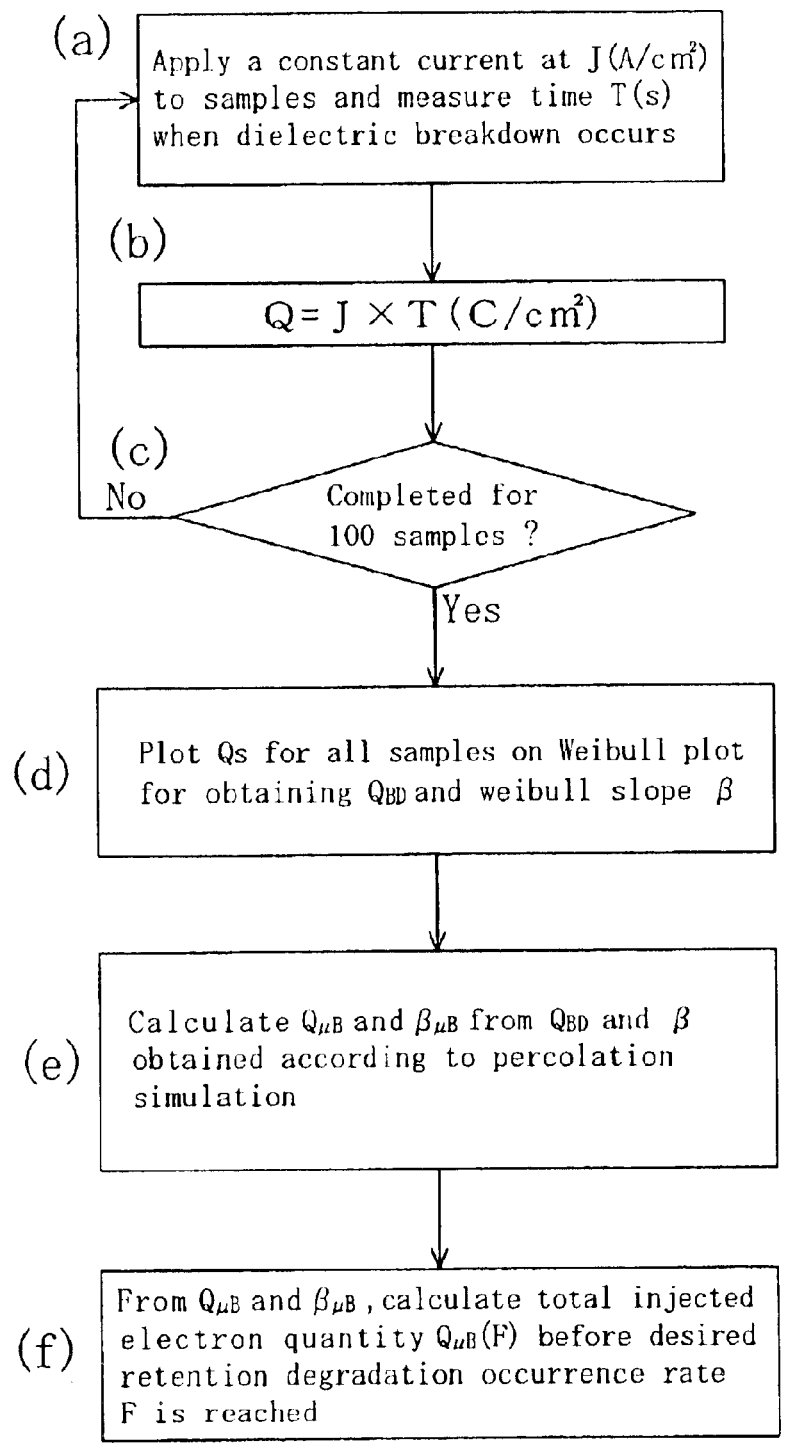
FIG. 6 is a flowchart illustrating a method for determining retention degradation in accordance with a first embodiment of the present invention.

FIG. 6 is a flowchart illustrating a method in accordance with a first embodiment of the present invention. In Step (a), a constant current stress is applied to a sample including a tunnel oxide film (which has a thickness of 7 nm and is formed of a silicon oxide film) at a predetermined current density J [A/cm$^2$]. Then, when a dielectric breakdown occurs, a time T [s] of the occurrence of the dielectric breakdown is recorded. Next, in Step (b), a total injected electron quantity Q [C/cm$^2$] before the dielectric breakdown occurs in the sample, is obtained by calculating J and T from the equation J×T. In Step (c), Steps (a) and (b) are repeatedly performed until completing the steps for all the samples, for example, 100 samples. Assume J is 10 mA/cm$^2$, for example. Then, when T=100s, Q=1 C/cm$^2$ holds. In this case, the samples are transistors or capacitors with a regular structure which has an oxide film formed at the same time as the tunnel oxide film to be evaluated or a film having the same film quality as that of the tunnel oxide film, cell transistors with a structure which allows potential control in its floating gate, or the like.

Figure 7:
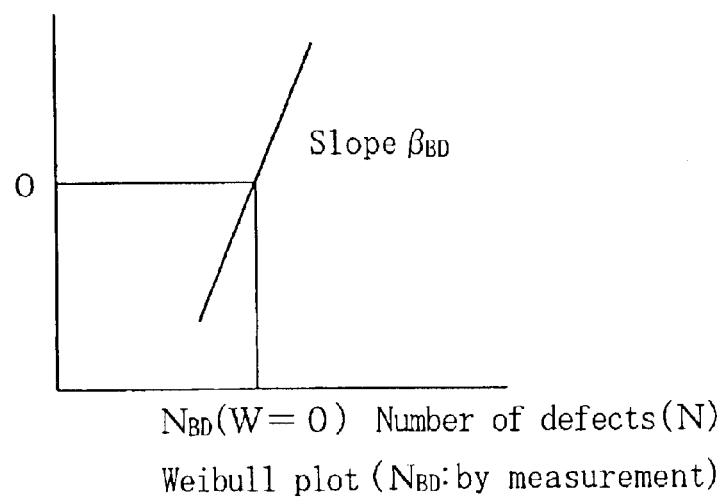
FIG. 7 is a Weibull plot used for describing the method for determining retention degradation in accordance with the first embodiment.

In Step (d), Qs for the 100 samples, which have been obtained in the manner described above, are plotted on a Weibull plot, and thereby a total injected electron quantity $Q_{BD}$ of a value at which a dielectric breakdown will expectedly occur in 63.2% (W=0) of the samples and a Weibull slope $\beta_{BD}$ as shown in FIG. 7 are calculated. In this case, when the electric breakdown occurs in 63.2% of the samples, the ordinate W (where W=ln(-ln(1-F)) and F is the dielectric breakdown occurrence rate) is 0 (i.e., the percent failures is 63.2%). According to these measurements, which have been performed in the foregoing manner, $Q_{BD}$ is obtained.

Next, the percolation simulation is performed. By a calculation using this simulation, in Step (e), a total injected electron quantity $Q\mu_B$ at which a $\mu$B-SILC will expectedly occur in 63.2% of the samples and a Weibull slope $\beta\mu_B$ of $Q\mu_B$ can be obtained. The percolation simulation herein is a simulation process for placing defects at random in an insulating film and calculating how many defects are placed in the insulating film before a dielectric breakdown or retention degradation is caused.

Thereafter, in Step (f), a total injected electron quantity $Q\mu_B$ (F) before a desired occurrence rate of retention degradation is reached is obtained from the total injected electron quantity $Q\mu_B$ and the Weibull slope $\beta\mu_B$.

Figure 8A:
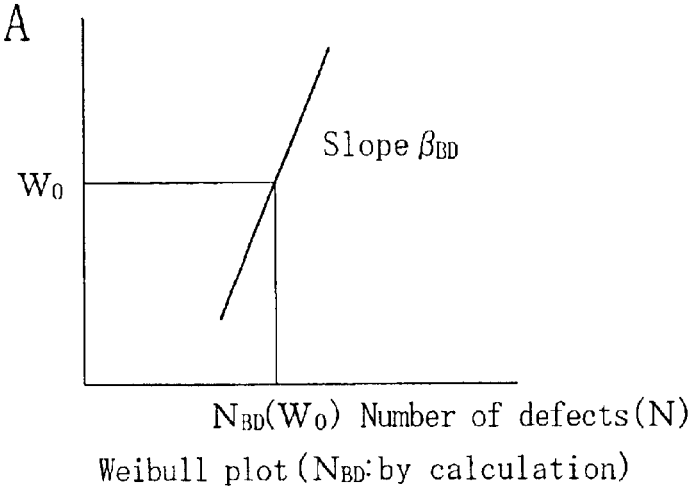
FIGS. 8A, 8B and 8C are graphs illustrating simulation of a Weibull plot of $N_{BD}$ and $N\mu_B$.

FIG. 8A is a so-called Weibull plot in which the abscissa indicates the number of defects ($N_{BD}$) which have been placed before a dielectric breakdown occurs and the ordinate indicates the dielectric breakdown occurrence rate. In FIG. 8A, it is assumed that the dielectric breakdown occurs when 10 defects align in the thickness direction of the film. By reference to FIG. 8A, the Weibull distribution and the Weibull slope of $N_{BD}$ can be seen.

Figure 8B:
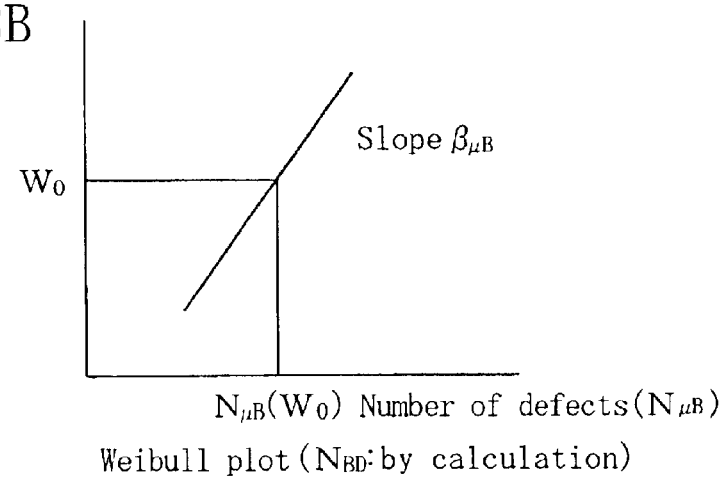

Likewise, FIG. 8B is a Weibull plot in which the abscissa indicates the number of defects ($N\mu_B$) which have been placed before retention degradation (i.e., the occurrence of a $\mu$B-SILC) is caused and the ordinate indicates the retention degradation occurrence rate. In FIG. 8B, it is assumed that the retention degradation is caused when two defects align in the thickness direction of the film. By reference to FIG. 8B, the Weibull distribution and the Weibull slope $\beta\mu_B$ of $N\mu_B$ can be seen.

Figure 8C:
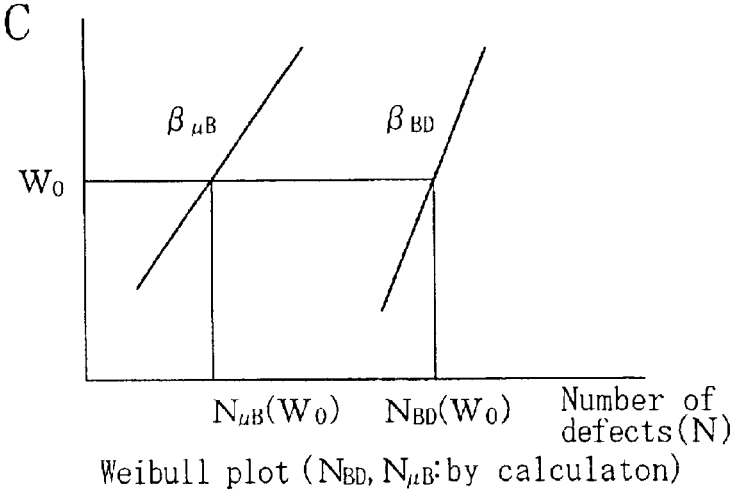

FIG. 8C is a Weibull plot generated by the combination of FIG. 8A and FIG. 8B. In FIG. 8C, the abscissa indicates the number of defects and the ordinate indicates the occurrence rate of dielectric breakdown and the occurrence rate of retention degradation. $N\mu_B(W_0)$ and $N_{BD}(W_0)$ can be seen at $W_0$ on the ordinate of the FIG. 8C, which indicates an occurrence rate of 63.2%. That is to say, by reference to FIG. 8C, the ratio between $N\mu_B(W_0)$ and $N_{BD}(W_0)$ can be seen, and the equation of $N\mu_B(W_0)/N_{BD}(W_0)=m$ is obtained. Also, as can be seen from FIG. 8C, the slope $\beta\mu_B$ and the slope $\beta_{BD}$ take different values at $W_0$. This is resulted from the difference between the necessary numbers of defects to align in the thickness direction of the film, as has been described before.

The correlation between the number of defects N and the injected electric charge quantity Q can be indicated by $N\mu hd B(W_0)/N_{BD}(W_0)=(Q\mu_B/Q_{BD})^\alpha=m$ (where α is an arbitrary number, e.g., 0.56). $Q\mu_B$ is the total injected electric charge quantity before retention degradation is caused, while $Q_{BD}$ is the total injected electric charge quantity before a dielectric breakdown occurs. $N\mu_B(W_0)/N_{BD}(W_0)$ is obtained by the simulation. $Q_{BD}$ has already been measured. Accordingly, $Q\mu_B$ at a cumulative occurrence rate of $W_0$ can be also obtained.

Figure 9:
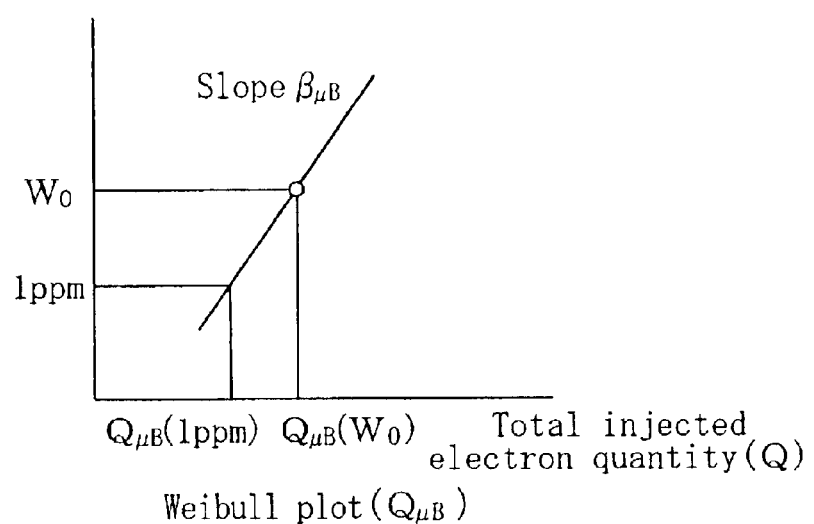
FIG. 9 is a graph illustrating calculation results of a Weibull plot of $Q\mu_B$.

Next, FIG. 9 is plotted to lay off injected electric charge quantities as abscissas and retention degradation occurrence rates as ordinates, thereby generating a Weibull plot. Then, a graph is drawn by the slope $\beta\mu_B$ which has been obtained in FIG. 8B and $Q\mu_B$ at the cumulative occurrence rate of $W_0$, which has been also obtained in the foregoing manner. An injected electric charge quantity $Q\mu_B$ (1 ppm) at a retention degradation occurrence rate of 1 ppm can be also obtained by taking the retention degradation occurrence rate of 1 ppm on the ordinate.

As can be seen from the above, in the present embodiment, using the simulation allows the injected electric charge quantity ($Q\mu_B$) with respect to the retention degradation occurrence rate to be easily obtained by actually measuring only the injected electric charge quantity ($Q_{BD}$) before a dielectric breakdown occurs.

Embodiment 2

In a second embodiment, another way for obtaining $Q\mu_B$ will be described. For the sake of simplicity, the same descriptions as in the first embodiment will be omitted.

As has been described, according to the calculation results obtained by the percolation simulation in FIG. 3, the graph of FIG. 4 has already been obtained. FIG. 4 shows the respective $Q\mu_B/Q_{BD}$ ratios (represented by calculated values) of the silicon oxide films having different thicknesses. For example, it can be seen from FIG. 4 that the $Q\mu_B/Q_{BD}$ ratio of the silicon oxide film having a thickness of 7 nm is about 5E-4. Then, when $Q_{BD}$ is $Q_{BD}=1C/cm^2$ from the measurement, $Q\mu_B$=about 5E-4C/cm² can be obtained according to the $Q\mu_B/Q_{BD}$ ratio. Note that E-X refers to $10^{-x}$ herein. For example, 5E-4 represents to $5\times10^{-4}$.

According to the second embodiment, the $Q\mu_B/Q_{BD}$ ratio is obtained on the basis of the respective thicknesses of the silicon oxide films shown in the graph of FIG. 4. However, the effective thickness of a silicon oxide film can be first determined based on the β value, which has been obtained when $Q_{BD}$ is measured, according to FIG. 5, and then the $Q\mu_B/Q_{BD}$ ratio can be obtained according to the effective thickness and the graph of FIG. 4. Since the β value is dependent on not only the film thickness but also the distribution of defects in an oxide film, higher accuracy is expected to be achieved when the $Q\mu_B/Q_{BD}$ ratio is obtained on the basis of the β value obtained by the measurements than when it is obtained on the basis of only the physical thickness of the film.

According to the second embodiment, $\beta\mu_B$ can be determined on the basis of the percolation simulation as shown in FIG. 5. However, $\beta\mu_B$ may be determined in some other manner. Also, $\beta\mu_B$ may be a fixed value. For example, $\beta\mu_B$ may be determined by a more accurate percolation simulation or some other simulation, or it may be a specific value obtained from statistics of failures which have occurred in a device in actual use. Moreover, the smaller the value $\beta\mu_B$ takes, the more widely the distribution varies, and thus it becomes difficult to obtain desired evaluation results. Therefore, $\beta\mu_B$ may be fixed at, e.g., a value in the rage from 0.5 to 2. Alternatively, $\beta\mu_B$ may be fixed at around 1 for certainty.

When the values for the total injected electron quantity $Q\mu_B$ and the Weibull slope $\beta\mu_B$ of $Q\mu_B$, at which a μB-SILC will expectedly occur statistically in 63.2% of the samples, are obtained in the above described manner, the total injected electron quantity $Q\mu_B(F)$ before the desired failure occurrence rate F (e.g., 1 ppm) is reached can be calculated according to the following equation:

$$F(Q)=1-\exp\{-Q/Q\mu_B\}^{\beta\mu_B}\} \quad (1)$$

Then, for example, when $Q\mu_B$=1.3E-3 C/cm², $\beta\mu_B$=1 and F=1 ppm, $Q\mu_B$(1 ppm)=1.3 nC/cm² can be obtained.

As has been described, in accordance with the second embodiment, the tunnel oxide film can be evaluated in an easy manner and a very short time, compared to the known evaluation method. Also reliability lifetime against the occurrence of failures due to μB-SILCs in a flash memory, which has ever been very difficult to estimate, can be determined.

Embodiment 3

Figure 10:
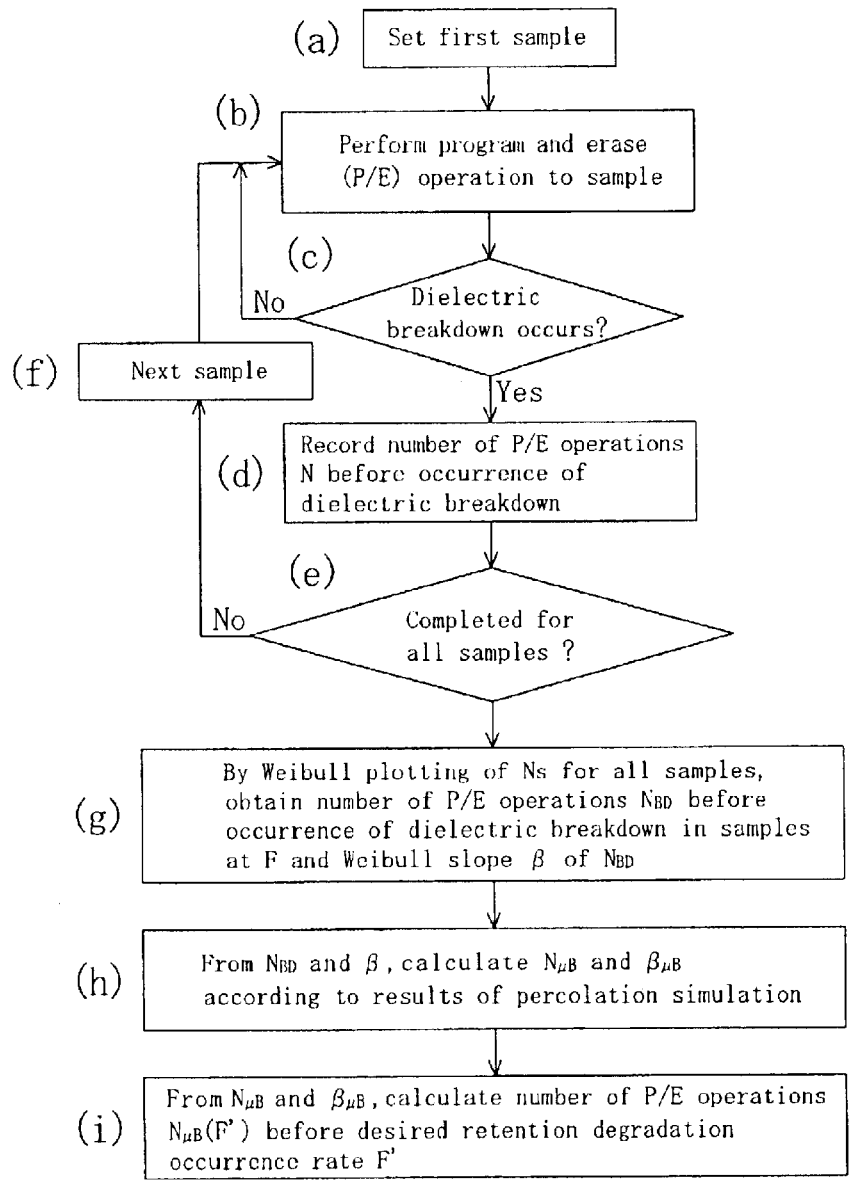
FIG. 10 is a flowchart illustrating an evaluation method using a memory cell of a flash memory, in accordance with a third embodiment of the present invention.

FIG. 10 illustrates a flowchart of an evaluation method using a memory cell of a flash memory in accordance with a third embodiment of the present invention. In Step (a), a first sample of a target group of memory cells is set for evaluation. In Step (b), under conditions for devices in actual use or conditions for an evaluation process, the sample memory cell is programmed and P/E operations are performed on the memory cell.

Then, in Step (c), it is determined whether or not a tunnel oxide film in the memory cell has caused a dielectric breakdown. If the dielectric breakdown has been not caused, the process goes back to Step (b) and then Steps (b) and (c) are repeated until the tunnel oxide film causes a dielectric breakdown. If the tunnel oxide film has caused a dielectric breakdown in Step (c), the number of P/E operations n which have been performed before the tunnel oxide film causes a dielectric breakdown is recorded in Step (d). Then, if these steps are not completed for a specified number of samples in Step (e), a next sample is set for evaluation in Step (f) and then Steps (b), (c) and (d) are repeatedly performed. After these process steps have been completed for all the samples, Step (g) is performed. In Step (g), the number of P/E operations n for the samples, which have been performed before the dielectric breakdown occurs, is plotted on a Weibull plot, thereby obtaining the number of P/E operations $n_{BD}$ before a dielectric breakdown is caused in the samples at a predetermined ratio F (e.g., 50% or 63.2% of the samples) and the Weibull slope β thereof.

Thereafter, in Step (h), according to results of the percolation simulation, the number of P/E operations $n_{mB}$ before the retention degradation is caused in the samples at a predetermined ratio F and the Weibull slope $\beta_{mB}$ thereof are obtained from $n_{BD}$ and β. Lastly, in Step (i), the number of P/E operations $n_{mB}$ (F') before a desired retention degradation occurrence rate F' is reached can be obtained from $n_{mB}$ and $\beta_{mB}$.

As can be seen from the above, in the present embodiment, using the percolation simulation allows the number of P/E operations ($n\mu_B$) with respect to the retention degradation occurrence rate to be easily obtained by actually measuring only the number of P/E operations $n_{BD}$ before a dielectric breakdown is caused.

The third embodiment is better than the first embodiment in respect that it is not required to calculate the number of P/E operations from $Q\mu_B$ obtained. Even though the P/E operation is repeatedly performed until a dielectric breakdown is caused and thus the necessary number of P/E operations may increase, compared to the foregoing embodiments, the total evaluation time can be reduced because no long-time shelf test is required after the P/E operations. Also, in this respect, a method in accordance with this embodiment is better than those of the foregoing embodiments.

According to the third embodiment, after a dielectric breakdown has been caused in a memory cell, the process moves to a next memory cell. However, it is also possible to perform P/E operations for all the memory cells of the target group and then determine whether a dielectric breakdown occurs in each memory cell. Also, the number of P/E operations is increased by one at a time, in this embodiment. However, the number of P/E operations may be increased, for example, by 100 or to 10 times the present number (i.e., 1, 10, 100, 1000, 10000 and so on) at a time. The number of P/E operations may, of course, be increased by $2^n$ (where n is a natural number) each time, as well.

The first, second and third embodiments have been described using the flash memory as an example of semiconductor devices. However, an inventive evaluation method can be applied to an insulating film used for a semiconductor device such as a MOSFET transistor. Furthermore, according to each of the embodiments, after a completed semiconductor device (e.g., a flash memory or a MOSFET transistor which have not yet been evaluated) has been fabricated, an insulating film in the completed device can be evaluated in a short time and with high accuracy. Accordingly, the cost of fabricating the semiconductor device can be reduced. Also, reliability lifetime against $\mu$B-SILC-induced failure in a semiconductor device (e.g., a flash memory), which has ever been very difficult to estimate, can be estimated in accordance with the present invention. Accordingly, it is possible to effectively fabricate a semiconductor device of which reliability is fully ensured. Note that it is more preferable to take into consideration not only the $\mu$B-SILC occurrence but also the amount of the generated $\mu$B-SILC in determining whether the device is a good or no-good product using an evaluation method in accordance with the embodiments of the present invention.

Evaluation Device and Program

Hereinafter, an evaluation device and an evaluation program for performing an evaluation method in accordance with the present invention will be described with reference to FIG. 11.

Figure 11:
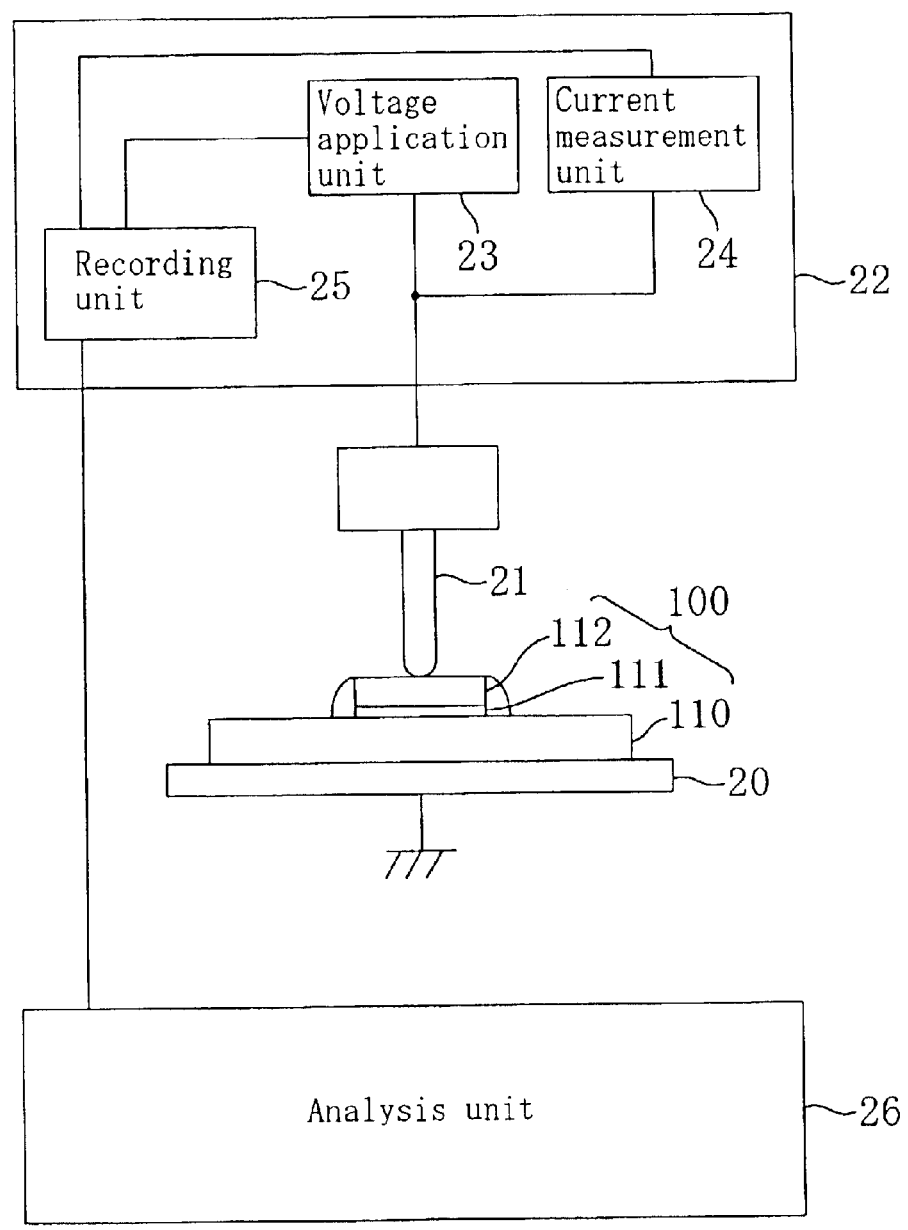
FIG. 11 is a diagram schematically illustrating the structure of an evaluation apparatus in accordance with an embodiment of the present invention.

The evaluation device shown in FIG. 11 includes a sample holder 20 for holding a sample 100, a probe 21 for making electrical contact with the sample 100 placed on the sample holder 20, a measurement unit 22 for applying an electrical stress to the sample 100 through the probe 21 and measuring current and/or voltage, and an analysis unit 26 for analyzing obtained data.

The sample 100 is, for example, a semiconductor device (e.g., a flash memory and a MOSFET transistor) which has been fabricated through a known semiconductor fabrication method. The sample 100 of FIG. 11 includes a silicon substrate 110, a gate oxide film 111 formed on the substrate 110 and a gate electrode 112 formed on the gate oxide film 111. The holder 20 for holding the sample 100 is preferably provided with a heater for heating the sample 100 during a stress appplication process. The holder 20 is electrically connected with the silicon substrate 110 of the sample 100 and is also grounded. The measurement unit 22 includes a voltage application section 23, a current measurement part 24 and a recording part 25. The recording part 25 is electrically connected with the analyzing unit 26. The recording part 25 and the analyzing part 26 may be optically connected with each other, for example, by an infrared ray. This structure may include a plurality of probes 21 and a plurality of holders 20.

Assume that the stress application process is performed by applying a constant voltage. The probe 21 is brought into contact with a specific part (e.g., a single or multiple electrode(s), the substrate and the like) of the sample 100 and then the voltage application section 23 is operated so as to apply a voltage to the probe 21 and the holder 20 to have a constant current flow therein. Thereafter, a dielectric breakdown occurrence time T(s) is measured and recorded in the recording part 25. If the stress application process is performed by applying a constant current, the constant current is supplied from a constant current supply unit (not shown in FIG. 11) to the sample 100 in the structure shown in FIG. 11.

The data that have been recorded by the recording part 25 is output to the analyzing unit 26, whereby Steps (d), (e) and (f) shown in FIG. 6, for example, are carried out. Step (b) in FIG. 6 may be performed either by the recording part 25 or the analyzing unit 26. Of course, the evaluation device with this structure can be applied to the methods of the second and third embodiments as well as that of the first embodiment. The recording part 25 and the analyzing unit 26 may be constructed in accordance with the method of each of the embodiments. The recording part 25 and the analyzing unit 26 may also be so constructed as to be applicable for any of the embodiments.

The total injected electron quantity ($Q_{BD}$) before a dielectric breakdown occurs is measured in the first and second embodiments, and the number of P/E operations ($n_{BD}$) before a dielectric breakdown occurs is measured in the third embodiment. However, in addition to $Q_{BD}$ and $n_{BD}$, a lifetime before a dielectric breakdown ($T_{BD}$), a total injected hole quantity (Qp), the threshold voltage of a transistor (Vt), and the amount of a current flow (I) (i.e., an FN tunnel current, a stress-induced leakage current or the like) at or after application of a predetermined electrical stress can be used as parameters. Then, if the threshold voltage (Vt) of a transistor and the amount of a current flow (I) at the time of application of a predetermined voltage are used as the parameters, a specified value may be set to each of their variations, and then the times which takes for the threshold voltage and the amount of a current flow to reach the respective specified values may be observed and used for evaluation. The total injected electron quantity ($Q_{BD}$), the total injected hole quantity (Qp), the number of P/E operations ($n_{BD}$) and the like may be used as the parameters in a manner in which variations around the time of application of an electrical stress are used as indexes.

As an electrical stress application method, a stepwise voltage application method in which an applied voltage is increased stepwise with time may be adopted as well as the constant voltage application method in which a constant voltage is applied and the constant current application method in which a constant current is supplied. Any of these methods can cause a dielectric breakdown, which leads to a clear judgement. That is to say, a drastic change that can be observed in the dielectric breakdown allows a clear judgement. Therefore, these methods are considered to be excellent electrical stress application methods.

Figure 12:
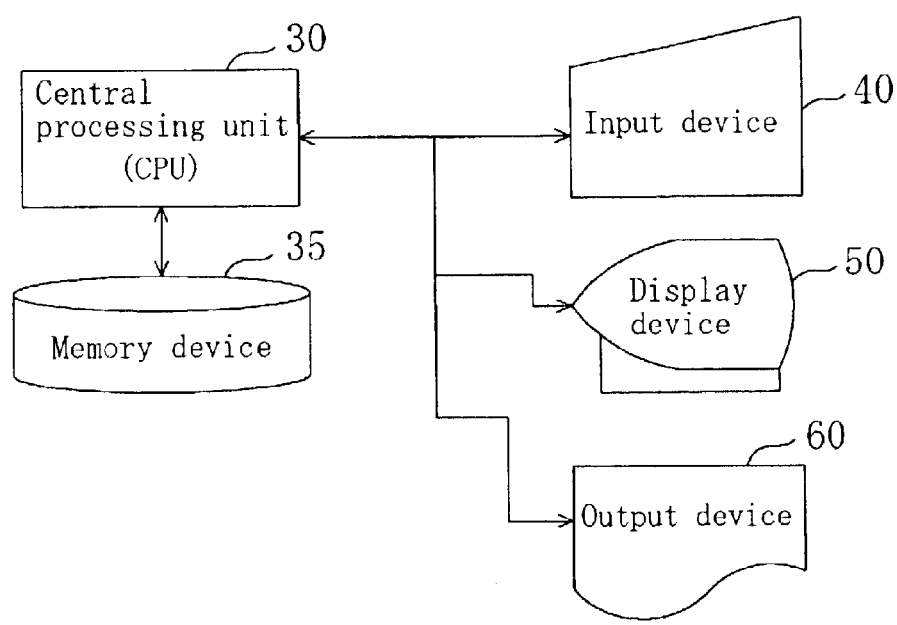
FIG. 12 schematically shows a computer configuration for running a semiconductor device evaluation program in accordance with the above embodiment.

The evaluation methods of the first, second and third embodiments can be carried out by a computer using a program. A typical computer configuration will be schematically illustrated in FIG. 12. The computer shown in FIG. 12 includes a central processing unit (CPU) 30 and a memory device 35 connected with the CPU 30. The CPU 30 is connected with an input device 40, a display 50, and an output device 60. The CPU 30 and the memory device 35 are provided in, for example, the analyzing unit 26 shown in FIG. 11. It is, of course, possible to place the CPU 30 and/or the memory device 35 in a physically remote location in the case of using the Internet or an intranet. In the same manner, the input device 40, the display 50, and the output 60 can be placed in a physically remote location.

The memory device 35 can use a magnetic recording medium (e.g., a hard disk), a RAM (i.e., a memory), an optical recording medium, an optical magnetic recording medium, and the like. A program for performing the evaluation method of the first, second or third embodiment is stored in the memory device 35. Note that the program may be constructed not only in the form of data recorded on a recording medium but also in the form of data that can be transferred by a transmitting medium. The input device 40 is, for example, a keyboard or a mouse. The display 50 is, for example, a CRT, a liquid crystal display panel or an organic EL display panel. And the output device 60 is, for example, a printer.

A program for performing the inventive evaluation method includes the following steps.

First, according to an input of the input device 40 of the computer, Step (a) is performed in which instructions for applying a voltage or a current at a predetermined level are given. As shown in FIG. 11, in performing Step (a), the sample 100 including a target insulating film 111 is set on the holder 20. Then, a voltage or a current at a predetermined level is applied to between the holder 20 and the probe 21 electrically connected with the sample 100 on the holder 20. The program may be so constructed that only a start input has to be input by a mouse, a keyboard or the like which serves as the input device 40. The program may also be so constructed that a selection of electrical stress application methods, a setting of a voltage or current level, and other settings such as a setting of the number of samples can be input either separately or at a time.

Next, Step (b) is performed. In Step (b), the amount of current or the voltage in the holder 20 and the probe 21 is monitored and then results of the monitoring are output into the display 50 of the computer. The program may be so constructed that a warning is displayed to indicate an evaluation failure if any abnormal state appears during an evaluating process. The program may also be so constructed that an estimated time which it takes for the program to complete its operation or the like is displayed.

Thereafter, Step (c) is performed. In Step (c), a cumulative time (T) which it takes for the amount of current or the voltage to reach a predetermined level or a total injected electron quantity (Q) obtained from the relationship between the cumulative time (T) and a current density (J) (the definite integral of J(t) from 0 to T) is stored in the memory device 35 of the computer. The cumulative time (T) and the total injected electron quantity (Q) may be recorded in the recording part 25 of the measurement unit 22 shown in FIG. 11 and then be stored in the memory device 35. Also, the functions of the recording part 25 may be wholly or partially combined with the memory device 35. The total injected electron quantity (Q) may be calculated by operating the CPU 30.

Thereafter, Steps (a), (b) and (c) are repeatedly performed for the same number of times as the number of the prepared samples 100 (e.g., 100 samples), and followed by Step (d) in which the cumulative times (T) or the total injected electron quantities (Q) for all the samples 100 are stored in the memory device 35.

Then, Step (e) is performed in which a time ($T_{BD}$) which it takes for the insulating film 111 to cause a dielectric breakdown at a predetermined occurrence rate (F) or the total injected electron quantity ($Q_{BD}$) is calculated from the cumulative times (T) or the total injected electron quantities (Q) for all the samples (e.g., data for 100 samples), which are stored in the memory device 35. Step (e) is performed by statistical analysis (e.g., Weibull plot) using the CPU 30. A predetermined occurrence rate herein is, for example, 50% or 63.2%.

Next, Step (f) is performed. In Step (f), a time ($T\mu_B$) which it takes for retention degradation to occur or a total injected electron quantity ($Q\mu_B$) before retention degradation occurs is calculated from the time ($T_{BD}$) or the total injected electron quantity ($Q_{BD}$) using the CPU 30. This calculation method itself can be implemented simply by performing the calculation procedures described in each of the foregoing embodiments in the form of software. Note that the simulation for calculating the correlation between $Q_{BD}$ and $Q\mu_B$ does not have to be performed for every measurement and that the simulation process may be omitted by replacing it with some other process. When the evaluation methods are performed in the form of software utilizing the program, an increased number of steps can be automatically performed, thus further facilitating semiconductor device evaluation.

The program may also include a process step of displaying on the display device 50 or outputting to the output device 60 the calculated time ($T\mu_B$) or the calculated total injected electron quantity ($Q\mu_B$) which it takes before the retention degradation is caused, which provides further improved convenience. Also, the method of the third embodiment can be performed by software. Furthermore, as described above, use as a parameter or parameters can be made of at least one physical quantity selected from the group consisting of the total injected electron quantity ($Q_{BD}$), the number of P/E operations ($n_{BD}$), the lifetime of dielectric breakdown ($T_{BD}$), the total injected hole quantity (Qp) which it takes before a dielectric breakdown occurs, the threshold voltage of a transistor (Vt), and the amount of a current flow (I) (i.e., an FN tunnel current, a stress-induced leakage current or the like) at or after application of a predetermined electrical stress.

According to an evaluation method in accordance with the present invention, an insulating film can be evaluated in a short time and with higher accuracy. Also, a reliability lifetime against $\mu$B-SILC-induced failure in a flash memory, which has ever been very difficult to estimate, can be obtained.

What is claimed is:

1. A semiconductor device evaluation method comprising:
   a first step of measuring a total injected electron quantity ($Q_{BD}$) before an insulating film causes a dielectric breakdown; and a second step of obtaining the ratio between the total injected electron quantity ($Q_{BD}$) and a total injected electron quantity ($Q\mu_B$) before retention degradation is caused, wherein, using the ratio and the total injected electron quantity ($Q_{BD}$), the total injected electron quantity ($Q\mu_B$) before retention degradation is caused is obtained.

2. The semiconductor device evaluation method of claim 1, wherein a statistical distribution of the total injected electron quantities ($Q\mu_B$) before retention degradation is caused is obtained using a different value from a Weibull slope $\beta_{BD}$ of the total injected electron quantity ($Q_{BD}$) before the insulating film causes the dielectric breakdown as a Weibull slope $\beta\mu_B$ of the total injected electron quantity ($Q\mu_B$) before the insulating film causes the retention degradation.

3. The semiconductor device evaluation method of claim 2, wherein a value in the range from 0.5 to 2 is used as the Weibull slope $\beta\mu_B$ of the total injected electron quantity ($Q\mu_B$) before the insulating film causes the retention degradation.

4. The semiconductor device evaluation method of claim 1, wherein the ratio between the total injected electron quantity ($Q_{BD}$) before the insulating film causes the dielectric breakdown and the total injected electron quantity ($Q\mu_B$) before the retention degradation is caused is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

5. A semiconductor device evaluation method, comprising:

a first step of calculating, according to the semiconductor device evaluation method of claim 1, a total injected electron quantity ($Q\mu_B$) before an insulating film causes retention degradation; and a second step of calculating the number of operations before the insulating film causes the retention degradation from the total injected electron quantity ($Q\mu_B$) and a quantity Qm of electric charge which has passed through the insulating film during an operation of a memory cell.

6. The semiconductor device evaluation method of claim 5, wherein $Q\mu_B$/Qm is used as the number of operations before the insulating film causes the retention degradation.

7. A semiconductor device evaluation method, comprising:

a first step of obtaining a Weibull plot of a total injected electron quantity ($Q_{BD}$) before an insulating film causes a dielectric breakdown;

a second step of obtaining, from the Weibull plot, a total injected electron quantity ($Q_{BD}(W_0)$) at a predetermined occurrence rate ($W_0$) of dielectric breakdown; and a third step of obtaining according to a percolation simulation a ratio between the total injected electron quantity ($Q_{BD}(W_0)$) at $W_0$ and a total injected electron quantity ($Q\mu_B(W_0)$) at $W_0$ retention degradation is caused, wherein a total injected electron quantity ($Q\mu_B(W)$) before retention degradation is caused at an arbitrary occurrence rate W is obtained from a Weibull slope $\beta\mu_B$, $W_0$ and the total injected electron quantity ($Q\mu_B(W_0)$).

8. The semiconductor device evaluation method of claim 7, wherein a statistical distribution of the total injected electron quantities ($Q\mu_B$) before retention degradation is caused is obtained using a different value from a Weibull slope $\beta_{BD}$ of the total injected electron quantity ($Q_{BD}$) before the insulating film causes the dielectric breakdown as a Weibull slope $\beta\mu_B$ of a total injected electron quantity ($Q\mu_B$) before the insulating film causes retention degradation.

9. The semiconductor device evaluation method of claim 7, wherein a value in the range from 0.5 to 2 is used as the Weibull slope $\beta\mu_B$ of the total injected electron quantity ($Q\mu_B$) before the insulating film causes the retention degradation.

10. The semiconductor device evaluation method of claim 7, wherein the ratio between the total injected electron quantity ($Q_{BD}$) before the insulating film causes the dielectric breakdown and the total injected electron quantity ($Q\mu_B$) before the retention degradation is caused is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

11. A semiconductor device evaluation method, comprising:

a first step of obtaining, according to the semiconductor device evaluation method of claim 7, a total injected electron quantity ($Q\mu_B$) before an arbitrary occurrence rate (W) of retention degradation is reached; and a second step of obtaining the number of operations before the occurrence rate (W) of retention degradation is reached from the total injected electron quantity ($Q\mu_B$) and a quantity Qm of electric charge which has passed through an insulating film during an operation of a memory cell.

12. The semiconductor device evaluation method of claim 11, wherein $Q\mu_B$/Qm is used as the number of operations before the insulating film causes the retention degradation.

13. The semiconductor device evaluation method of any one of claims 1, 2, 4, 8 and 10, wherein a percolation simulation is used.

14. A semiconductor device evaluation method, comprising:

a first step of obtaining a Weibull plot of the number of Program/Erase operations ($n_{BD}$) which have been performed before an insulating film causes a dielectric breakdown;

a second step of obtaining, from the Weibull plot, the number of P/E operations ($n_{BD}(W_0)$) at a predetermined occurrence rate ($W_0$) of dielectric breakdown;

a third step of obtaining, according to a percolation simulation, a ratio between the number of Program/Erase operations ($n_{BD}(W_0)$) at $W_0$ and the number of Program/Erase operations ($n\mu_B(W_0)$) at $W_0$ before the retention degradation is caused, wherein the number of P/E operations ($n\mu_B(W)$) before retention degradation is caused at an arbitrary occurrence rate W is obtained from a Weibull slope $\beta\mu_B$ of the number of Program/Erase operations ($n\mu_B$) before retention degradation is caused, $W_0$ and the number of Program/Erase operations ($n\mu_B(W_0)$) before the insulating film causes the retention degradation.

15. The semiconductor device evaluation method of claim 14, wherein a statistical distribution of the number of Program/Erase operations ($n\mu_B$) before the insulating film causes the retention degradation is obtained using a different value from a Weibull slope $\beta_{BD}$ of the number of Program/Erase operations ($n_{BD}$) before the insulating film causes a dielectric breakdown as the Weibull slope $\beta\mu_B$ of the number of Program/Erase operations ($n\mu_B$) before the insulating film causes the retention degradation.

16. The semiconductor device evaluation method of claim 15, wherein a value in the range from 0.5 to 2 is used as the Weibull slope $\beta\mu_B$ of the number of Program/Erase operations ($n\mu_B$) before the insulating film causes the retention degradation.

17. The semiconductor device evaluation method of claim 14, wherein the ratio between the number of Program/Erase operations ($n_{BD}$) before the insulating film causes the dielectric breakdown and the number of Program/Erase operations ($n\mu_B$) before the insulating film causes the retention degradation is obtained by a first step of obtaining the total number of defects ($N_{BD}$) in the insulating film before the insulating film causes the dielectric breakdown and a second step of obtaining the total number of defects ($N\mu_B$) in the insulating film before the retention degradation is caused.

18. A semiconductor device fabrication method, comprising the steps of:
  preparing a completed semiconductor device including an insulating film; and
  determining whether the completed semiconductor device is good or no-good using the semiconductor device evaluation method of any one of claims 1, 5, 7, 11 and 14.

* * * * *